(12) United States Patent
Chen et al.

(10) Patent No.: US 10,032,983 B2
(45) Date of Patent: Jul. 24, 2018

(54) ELECTRON TRANSFER COMPOSITION FOR USE IN AN ELECTRON INJECTION LAYER FOR ORGANIC ELECTRONIC DEVICES

(71) Applicant: Merck Patent GmbH, Darmstadt (DE)

(72) Inventors: Lichun Chen, Southampton (GB); Frank Egon Meyer, Kronberg (DE); Andromachi Malandraki, Southampton (GB); Piotr Wierzchowiec, Southampton (GB); Tomas Backlund, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 14/893,134

(22) PCT Filed: May 9, 2014

(86) PCT No.: PCT/EP2014/001256
§ 371 (c)(1),
(2) Date: Nov. 23, 2015

(87) PCT Pub. No.: WO2014/191076
PCT Pub. Date: Dec. 4, 2014

(65) Prior Publication Data
US 2016/0181533 A1    Jun. 23, 2016

(30) Foreign Application Priority Data
May 27, 2013 (EP) ..................... 13002741

(51) Int. Cl.
H01L 51/00    (2006.01)
C08F 220/06    (2006.01)
(Continued)

(52) U.S. Cl.
CPC ............ *H01L 51/0035* (2013.01); *C01D 7/00* (2013.01); *C08F 112/08* (2013.01);
(Continued)

(58) Field of Classification Search
None
See application file for complete search history.

(56) References Cited

U.S. PATENT DOCUMENTS 7,235,171 B2    6/2007  Taniguchi
8,475,937 B2    7/2013  Suzuki et al.
(Continued)

FOREIGN PATENT DOCUMENTS

CN    102015900 A    4/2011
CN    102395627 A    3/2012
(Continued)

OTHER PUBLICATIONS

International Search Report from PCT Application No. PCT/EP2014/001256 dated Jul. 28, 2014.
(Continued)

*Primary Examiner* — Katie L Hammer
(74) *Attorney, Agent, or Firm* — Millen, White, Zelano and Branigan, P.C.

(57) ABSTRACT

The present invention relates to a novel electron transfer composition comprising one or more metal ion comprising compound, the use of such electron transfer composition in organic electronic devices, particularly in photodiodes, as well as such organic electronic devices, particularly photodiodes.

12 Claims, 2 Drawing Sheets

(51) Int. Cl.
  *C01D 7/00* (2006.01)
  *C08F 112/08* (2006.01)
  *H01B 1/12* (2006.01)
  *H01L 51/42* (2006.01)
(52) U.S. Cl.
  CPC .......... *C08F 220/06* (2013.01); *H01B 1/122* (2013.01); *H01L 51/0036* (2013.01); *H01L 51/0037* (2013.01); *H01L 51/0042* (2013.01); *H01L 51/0047* (2013.01); *H01L 51/424* (2013.01)

(56) References Cited

U.S. PATENT DOCUMENTS

| | | |
|---|---|---|
| 8,906,560 B2 | 12/2014 | Lee et al. |
| 8,945,427 B2 | 2/2015 | Hsu |
| 9,040,112 B2 | 5/2015 | Kanitz |
| 2003/0024813 A1 | 2/2003 | Taniguchi |
| 2006/0225783 A1 | 10/2006 | Iwanaga |
| 2011/0017986 A1 | 1/2011 | Suzuki et al. |
| 2011/0143258 A1 | 6/2011 | Lee et al. |
| 2012/0145966 A1 | 6/2012 | Hsu |
| 2013/0316228 A1 | 11/2013 | Moc et al. |
| 2014/0084280 A1 | 3/2014 | Chiba |
| 2014/0143189 A1 | 5/2014 | Matsuyama |
| 2014/0150868 A1* | 6/2014 | Ichibayashi ............ C07C 49/92 136/263 |

FOREIGN PATENT DOCUMENTS

| | | |
|---|---|---|
| DE | 102010062726 A1 | 6/2012 |
| EP | 2040317 A2 | 3/2009 |
| JP | 2007281039 A | 10/2007 |
| JP | 2009076461 A | 4/2009 |
| JP | 2013008935 A | 1/2013 |
| JP | WO 2013024595 A1 * | 2/2013 ............ C07C 49/92 |
| WO | 2009120434 A1 | 10/2009 |
| WO | 2010124166 A2 | 10/2010 |
| WO | 2012160714 A1 | 11/2012 |

OTHER PUBLICATIONS

Chinese Office Action dated Nov. 30, 2016 issued in corresponding CN 201480030245.7, 12 pages.

English translation Abstract of CN102015900A published Apr. 13, 2011 (1 page).

English translation Abstract of CN102395627A published Mar. 28, 2012 (2 pages).

Office Action in corresponding Japan patent application dated Mar. 6, 2018.

* cited by examiner

ELECTRON TRANSFER COMPOSITION FOR USE IN AN ELECTRON INJECTION LAYER FOR ORGANIC ELECTRONIC DEVICES

TECHNICAL FIELD

The present invention relates to a novel electron transfer composition comprising one or more metal ion comprising compound, the use of such electron transfer composition in organic electronic devices, particularly in photodiodes, as well as such organic electronic devices, particularly photodiodes.

BACKGROUND AND DESCRIPTION OF THE PRIOR ART

Recently, organic compounds have attracted widespread attention from academic as well as industrial research groups for use in organic electronics (OE), such as for example in photodiodes, photoconductors, organic light emitting diodes (OLEDs), and organic photovoltaics (OPV).

In these applications organic compounds offer numerous advantages for intermediate and final products as well as for their fabrication. To name a few advantages only, organic compounds offer weight reduction, flexibility and ease of mass production, for example by using printing methods.

Furthermore, the introduction of substituents allows for easy modification of the organic compounds, thus permitting to fine-tune their properties to the requirements of the intended application.

Chen et al., J. Appl. Phys. 103, 103721 (2008), disclose cesium carbonate as a functional interlayer at the cathode interface for polymer photovoltaics devices.

KR-A-20090013388 discloses an organic light emitting device with an electron injection layer, which is formed on the light emitting layer and is made of metal salts doped electron transport material.

Xu et al., Materials Science and Engineering C 32 (2012) 685-691, disclose a inverted polymer solar cell which was fabricated with cesium carbonate modified indium tin oxide substrates as the electrode and molybdenum trioxide modified aluminum as the anode.

Wu et al., Appl. Phys. Lett. 88, 152104 (2006), discuss electronic structures and electron-injection mechanisms of cesium carbonate-incorporated cathode structures for organic light emitting devices.

Huang et al., Adv. Funct. Mater. 2007, 17, 1966-1973, disclose low-work-function surfaces formed by solution-processed and thermally deposited nanoscale layers of cesium carbonate.

Li et al., Appl. Phys. Lett. 88, 253503 (2006), disclose the effect of interfacial buffer layers—vanadium oxide ($V_2O_5$) and cesium carbonate ($Cs_2CO_3$)—on the performance of polymer solar cells.

US-A-2011/057920 discloses organic electroluminescence display devices, wherein the electron injection layer may contain at least one alkali metal and alkaline-earth metal.

However, the use in photodiodes poses very high requirements on the organic compounds in that the injection current from the electrodes under reverse bias is to be as small as possible, and in that impurities have to be avoided as much as possible, frequently necessitating the production of photodiodes in a clean room environment.

While much progress has been made, there is still room to improve the performance of organic compounds in certain applications and also to enlarge the pool of available compounds and compositions for certain applications. Additional advantages of the present invention will become evident from the following description and examples.

SUMMARY OF THE INVENTION

It has now been surprisingly found that the presently disclosed electron transfer composition shows excellent properties.

The present application therefore provides for an electron transfer composition comprising one or more metal ion comprising compound.

The invention further relates to a formulation comprising the electron transfer composition according to the present invention and, optionally, one or more solvents, preferably selected from organic solvents.

The present invention also relates to an organic electronic device comprising an electron transfer layer, said electron transfer layer comprising the electron transfer composition of the present invention.

The present invention further relates to a process for the preparation of an electron transport layer, said electron transport layer comprising the electron transfer composition of the present invention.

The invention also relates to the use of the electron transfer composition according to the present invention as charge transport, semiconducting, electrically conducting, photoconducting or light emitting material, or in an optical, electrooptical, electronic, electroluminescent or photoluminescent device, or in a component of such a device or in an assembly comprising such a device or component.

The invention further relates to an optical, electrooptical, electronic, electroluminescent or photoluminescent device, or a component thereof, or an assembly comprising such device or component, which comprises an electron transfer composition or a formulation or a mixture or a blend, or comprises a charge transport, semiconducting, electrically conducting, photoconducting or light emitting material in accordance with the present invention.

The optical, electrooptical, electronic, electroluminescent and photoluminescent devices include, without limitation, organic field effect transistors (OFETs), organic thin film transistors (OTFTs), organic light emitting diodes (OLEDs), organic light emitting transistors (OLETs), organic photovoltaic devices (OPVs), organic photodetectors (OPDs), organic solar cells, laser diodes, Schottky diodes, photoconductors, and photodiodes. Preferably, the present devices are selected from the group consisting of organic light emitting diodes, organic light emitting transistors, organic photovoltaic devices, organic photodetectors, photoconductors and photodiodes. More preferably, the present devices are selected from the group consisting of photodiodes, organic light emitting diodes, organic photovoltaic devices and photoconductors. Most preferably, the present devices are photodiodes.

The components of the above devices include, without limitation, charge injection layers, charge transport layers, interlayers, planarizing layers, antistatic films, polymer electrolyte membranes (PEM), conducting substrates and conducting patterns.

The assemblies comprising such devices or components include, without limitation, integrated circuits (IC), radio frequency identification (RFID) tags or security markings or security devices containing them, flat panel displays or backlights thereof, electrophotographic devices, electrophotographic recording devices, organic memory devices, sensor devices, biosensors and biochips, touchless screens or digital x-ray plates.

DETAILED DESCRIPTION OF THE INVENTION

Definitions

Figure 1A:
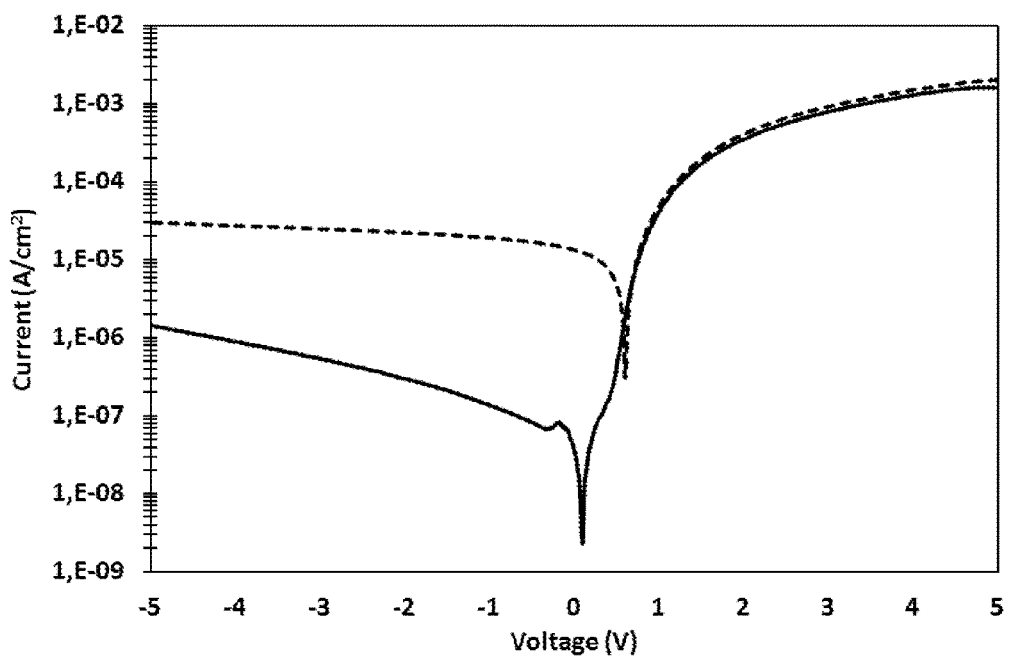
FIG. 1A—shows the IV curves for the photodiode of Example 1 in the dark (solid line) as well as under irradiation with light of 950 nm (dashed line).
Figure 1B:
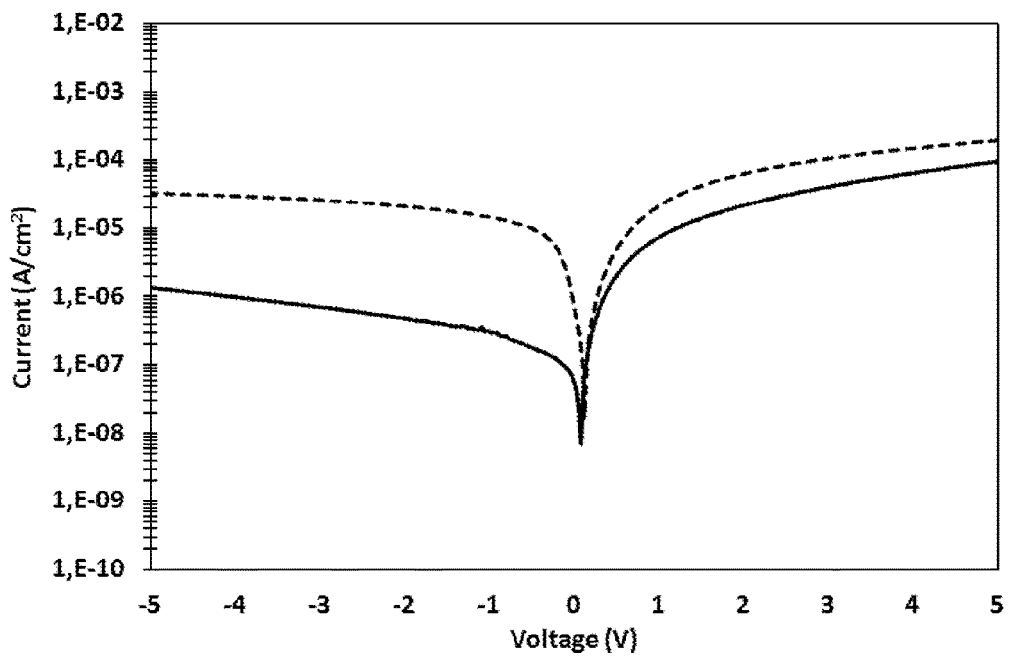
FIG. 1B—shows the IV curves for the photodiode of Example 2 in the dark (solid line) as well as under irradiation with light of 950 nm (dashed line).
Figure 1C:
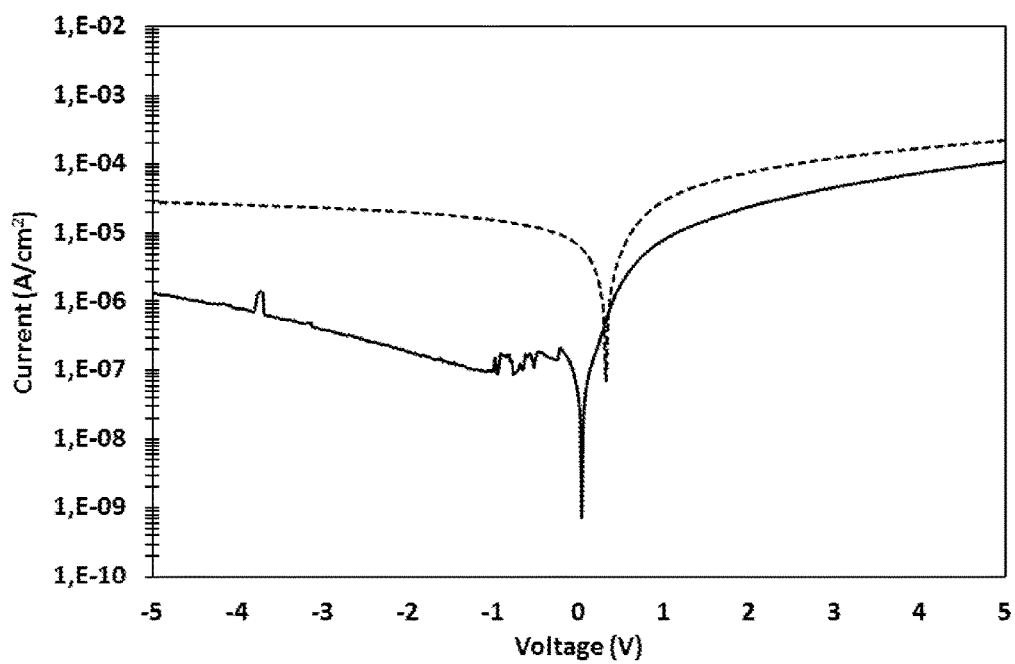
FIG. 1C—shows the IV curves for the photodiode of Example 3 in the dark (solid line) as well as under irradiation with light of 950 nm (dashed line).

For the purpose of the present application an asterisk ("*") denotes a linkage to an adjacent unit or group, and in case of a polymer it may denote a link to an adjacent repeating unit or to a terminal group of the polymer chain. The asterisk may further be used to denote the ring atoms at which aromatic or heteroaromatic rings are fused to other aromatic or heteroaromatic rings.

As used herein, the term "polymer" will be understood to mean a molecule of high relative molecular mass, the structure of which essentially comprises the multiple repetition of units derived, actually or conceptually, from molecules of low relative molecular mass (Pure Appl. Chem., 1996, 68, 2291). The term "oligomer" will be understood to mean a molecule of intermediate relative molecular mass, the structure of which essentially comprises a small plurality of units derived, actually or conceptually, from molecules of lower relative molecular mass (Pure Appl. Chem., 1996, 68, 2291). In a preferred meaning as used herein a polymer will be understood to mean a compound having >1, i.e. at least 2 repeat units, preferably ≥5 repeat units, and an oligomer will be understood to mean a compound with >1 and <10, preferably <5, repeat units.

Further, as used herein, the term "polymer" will be understood to mean a molecule that encompasses a backbone (also referred to as "main chain") of one or more distinct types of repeat units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the terms "repeat unit", "repeating unit" and "monomeric unit" are used interchangeably and will be understood to mean the constitutional repeating unit (CRU), which is the smallest constitutional unit the repetition of which constitutes a regular macromolecule, a regular oligomer molecule, a regular block or a regular chain (Pure Appl. Chem., 1996, 68, 2291). As further used herein, the term "unit" will be understood to mean a structural unit which can be a repeating unit on its own, or can together with other units form a constitutional repeating unit.

As used herein, a "terminal group" will be understood to mean a group that terminates a polymer backbone. The expression "in terminal position in the backbone" will be understood to mean a divalent unit or repeat unit that is linked at one side to such a terminal group and at the other side to another repeat unit. Such terminal groups include endcap groups, or reactive groups that are attached to a monomer forming the polymer backbone which did not participate in the polymerisation reaction, like for example a group having the meaning of $R^5$ or $R^6$ as defined below.

As used herein, unless stated otherwise the molecular weight is given as the number average molecular weight $M_n$ or weight average molecular weight $M_w$, which is determined by gel permeation chromatography (GPC) against polystyrene standards in eluent solvents such as tetrahydrofuran, trichloromethane (TCM, chloroform), chlorobenzene or 1,2,4-trichlorobenzene. Unless stated otherwise, 1,2,4-trichlorobenzene is used as solvent. The degree of polymerization, also referred to as total number of repeat units, n, will be understood to mean the number average degree of polymerization given as n=$M_n/M_U$, wherein $M_n$ is the number average molecular weight of the polymer and $M_U$ is the molecular weight of the single repeat unit, see J. M. G. Cowie, *Polymers: Chemistry & Physics of Modern Materials*, Blackie, Glasgow, 1991.

The present electron transfer composition comprises one or more metal ion comprising compound. The term "metal ion comprising compound" is used to denote a compound comprising one or more metal ions. Preferred metal ions are selected from the group consisting of caesium ions, barium ions and a blend of these.

Preferred electron transfer compositions comprise one or more metal ion comprising compound selected from the group consisting of metal oxides, metal carbonates, metal hydroxides, and metal carboxylates.

More preferred electron transfer compositions comprise one or more metal ion comprising compound selected from the group consisting of $Cs_2O$, $Cs_2CO_3$, CsOH, $Ba(OH)_2$, BaO, $BaCO_3$, Cs-carboxylates, Ba-carboxylates, inorganic salts or compounds comprising Cs or Ba ions and blends of any of these.

Most preferred electron transfer compositions are those, which comprise one or more metal ion comprising compound selected from the group consisting of $Cs_2CO_3$, CsOH, and Cs-carboxylate.

Preferred examples of metal carboxylates are organic compounds comprising at least one group —COOM, wherein M=$Cs^+$ or M=0.5 $Ba^{2+}$. Even more preferred examples of metal carboxylates are polymers comprising at least one group —COOM, wherein M=$Cs^+$ or M=0.5 $Ba^{2+}$. Suitable metal carboxylates are for example organic polymers comprising at least one group —COOM, wherein M=$Cs^+$ or M=0.5 $Ba^{2+}$.

Such group —COOM may be terminal or non-terminal. If the group —COOM is terminal, such group is considered an end group on the principal polymer chain. It is noted that the principal polymer chain may also be referred to as polymer backbone. If such group —COOM is non-terminal, such group may for example be bonded to an atom that forms part of the principal polymer chain, or alternatively it may be bonded to an atom that forms part of a side chain. The term "side chain" is used to denote a polymer chain of the same polymer molecule that is, however, shorter that the polymer backbone.

Examples of suitable polymers are represented by general formula (I)

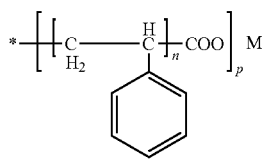

(I)

wherein p=1 and M=Cs$^+$, or p=2 and M=Ba$^{2+}$. Parameter n is as defined below. Particularly suited is a polymer of general formula (I) wherein p=1 and M=Cs$^+$.

Further examples of suitable polymers are represented by general formulae (II-a) or (II-b)

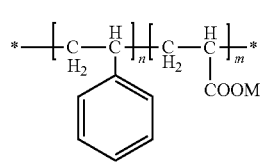

(II-a)

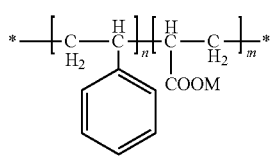

(II-b)

wherein m is at least 1, and M=Cs$^+$ or M=0.5 Ba$^{2+}$. Parameter n is as defined below. Particularly suited is a copolymer of general formula (II-a) or (II-b), wherein m is at least 1 and M=Cs$^+$.

Additional examples of suitable polymers are represented by general formula (III)

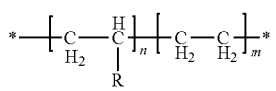

(III)

wherein n is at least 1 and R is a phenyl group substituted with at least one group COOM or an alkyl group substituted with at least one group COOM.

In case of R being a phenyl group it may be substituted with one, two, three, four or five groups COOM. Parameter m is as defined below.

Alternatively, R may also be phenyl to which one or more five-membered or six-membered aromatic or non-aromatic ring may be annealed. Examples are naphthalene and indene.

R may for example be selected from one of the following

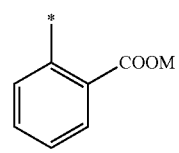

(III-a)

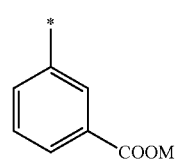

(III-b)

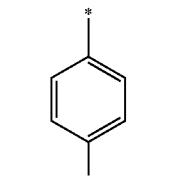

(III-c)

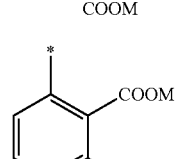

(III-d)

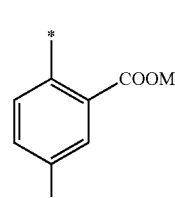

(III-e)

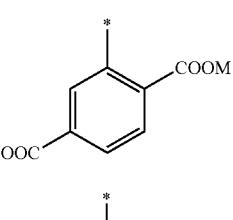

(III-f)

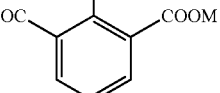

(III-g)

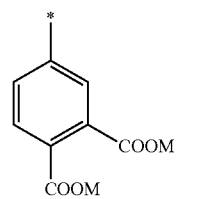

(III-h)

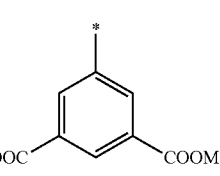

(III-j)

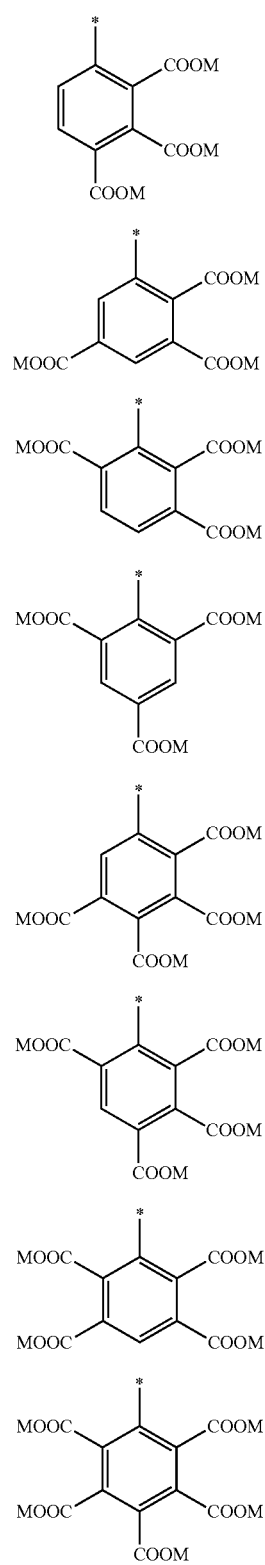

wherein M=Cs⁺ or M=0.5 Ba²⁺. Preferred groups R have at most four groups COOM. More preferred groups R have at most three groups COOM. Even more preferred groups R have at most two groups COOM. Most preferred groups have one group COOM.

In formulae (III-a) to (III-r) any one of the hydrogen atoms on the phenyl rings may also be substituted with an alkyl group having from 1 to 10 carbon atoms. Said alkyl groups may be linear or branched. Suitable examples of such alkyl groups having from 1 to 10 carbon atoms are methyl, ethyl, n-propyl, iso-propyl, n-butyl, iso-butyl, tert-butyl, pentyl, hexyl, heptyl, octyl, nonyl or decyl. It is preferred that at most one of the hydrogen atoms is substituted with such an alkyl group, preferably with an alkyl group having from 1 to 5 carbon atoms. Suitable examples of such alkyl groups having from 1 to 10 carbon atoms are methyl, ethyl, n-propyl, iso-propyl, n-butyl, iso-butyl, tert-butyl, and pentyl. Said alkyl groups may in term be substituted with one or more groups COOM, wherein M=Cs⁺ or M=0.5 Ba²⁺.

R may for example also be a linear or a branched alkyl group having from 1 to 20 carbon atoms. They may be substituted with a number of groups COOM, said number being at least one and at most the number of carbon atoms of said alkyl group. Suitable examples of such alkyl groups are methyl, ethyl, n-propyl, iso-propyl, n-butyl, iso-butyl, tert-butyl, pentyl, hexyl, heptyl, octyl, nonyl or decyl, wherein at least one hydrogen is replaced by a group COOM.

The type of polymer to be blended with the metal ion comprising compound is not particularly limited. It is, however, preferred that the polymer(s) to be blended with the metal ion comprising compound can be dissolved in the same solvent or solvent blend as the metal ion comprising compound. Suitable polymers may for example include ion-conducting polymers. Examples of suitable polymers may comprise one or more monomers selected for example from the following non-exhaustive group consisting of olefins and fluorinated olefins, acrylic acid, vinyl, dienes (such as for example butadiene), styrene, methacrylic acid and derivatives of these. Preferred examples of suitable polymers include polypropylene, polystyrene, polymethacrylates, polyacrylates and respective copolymers. More preferred examples of suitable polymers include poly(t-butyl acrylate-co-ethyl acrylate-co-methacrylic acid), poly(styrene-co-methacrylic acid) and poly(4-vinylphenol). Poly(4-vinylphenol) is most preferred.

Examples of olefins are ethylene, propylene, butene, pentene, hexene, heptene, octene, and 4-methyl-1-pentene.

Examples of fluorinated olefins are ethylene, propylene, butene, pentene, hexene, heptene, and octene, wherein at least one, preferably all, hydrogen atoms is/are replaced with fluorine atoms.

An example of a diene is 1,3-butadiene.

Examples of vinyl are α-vinylnaphthalene, 4-vinyltoluene, vinylcyclohexane, vinylcinnamate, 4-vinylbiphenyl, Values for n and m in formulae (I), (II-a), (II-b) and (III) are preferably chosen such that the weight average molecular weight $M_w$ of the polymer or copolymer is in the range from 100 g/mol to 1,000,000 g/mol With regards to relative values for m and n in the copolymer of general formula (II) they are preferably chosen such that the respective blocks have a weight ratio of 5:95 to 95:5.

Though not particularly limited, it is preferred that the concentration of metal ions in the present electron transfer composition is at least 0.01 mmol per gram of electron transfer composition. For example, said concentration may be at least 0.02 mmol or 0.03 mmol or 0.04 mmol or 0.05 mmol or 0.06 mmol or 0.07 mmol or 0.08 mmol or 0.09 mmol or 0.1 mmol or 0.2 mmol or 0.3 mmol or 0.4 mmol or 0.5 mmol or 0.6 mmol or 0.7 mmol or 0.8 mmol or 0.9 mmol or 1.0 mmol per gram of electron transfer composition. Though not particularly limited, it is preferred that the concentration of metal ions in the present electron transfer composition is at most 1.0 mol per gram of electron transfer composition. For example, said concentration of metal ions may be at most 0.5 mol or 0.1 mol or 0.05 mol or 0.04 mol or 0.03 mol or 0.02 mol or 0.01 mol or 0.009 mol or 0.008 mol or 0.007 mol or 0.006 mol or 0.005 mol or 0.004 mol or 0.003 mol or 0.002 mol per gram of electron transfer composition.

In case of the one or more metal ion comprising compound being a polymer, the electron transfer composition may comprise at least 40 wt %, for example at least 50 wt %, 60 wt %, 70 wt %, 80 wt %, or 90 wt %, relative to the total weight of said electron transfer composition, of one or more polymer of formulae (I), (II-a), (II-b) or (III). Alternatively, the electron transfer composition may consist of such a polymer. The metal ion concentration may then be adapted such that it is within the above defined ranges.

In formulae (I), (II-a), (II-b) and (III) values for m and n are advantageously chosen such that the desired molecular weight $M_w$ of the polymer as well as the desired concentration of metal ions in the present electron transfer composition is reached. With regards to formula (I), n preferably is an integer of at least 1 and more preferably may be chosen for example in the range from 1 to 10,000. With regards to formulae (II-a) and (II-b), n preferably is 0 or an integer of at least 1 and more preferably may be chosen for example in the range from 0 to 10,000, and m may be chosen for example in the range from 1 to 10,000. With regards to formula (III), m preferably is 0 or an integer of at least 1 and more preferably may be chosen for example in the range from 0 to 10,000, and n preferably may be chosen for example in the range from 1 to 10,000.

The formulations of the present invention comprise the electron transfer composition in accordance with the present invention and, optionally, one or more solvents. Preferably, the formulations of the present invention comprise said electron transfer composition and one or more solvents. Preferred solvents are selected from water and organic solvents. Examples of preferred organic solvents are alcohols, ketones, ethers and aromatic solvents.

Specifically suited alcohols have the general formula $R_1$—OH, wherein $R_1$ is a branched or linear alkyl group having from 1 to 20 carbon atoms. Specific examples of well suited alcohols are methanol, ethanol, propanol, iso-propanol and 2-ethoxyethanol. Of these, methanol and 2-ethoxyethanol are more preferred. Methanol is particularly well suited.

Specifically suited ketones have the general formula $R_1$—C(=O)—$R_2$, wherein $R_1$ and $R_2$ are independently of each other a branched or linear alkyl group having from 1 to 20 carbon atoms. Specific examples of well suited ketones are acetone and ethylmethylketone.

Specifically suited ethers have the general formula $R_1$—O—$R_2$, wherein $R_1$ and $R_2$ are independently of each other a branched or linear alkyl group having from 1 to 20 carbon atoms. Specific examples of well suited ethers are dimethylether and diethylether.

Specifically well suited examples of aromatic solvents are toluene and xylene. Of these toluene is preferred.

Alternatively it is also possible to use ethylene glycol.

The electron transfer compositions and formulations according to the present invention can additionally comprise one or more further components or additives selected for example from surface-active compounds, lubricating agents, wetting agents, dispersing agents, hydrophobing agents, adhesive agents, flow improvers, defoaming agents, deaerators, diluents which may be reactive or non-reactive, auxiliaries, colorants, dyes or pigments, sensitizers, stabilizers, nanoparticles or inhibitors.

In a preferred embodiment, the present electron transfer composition further comprises a binder. The type of binder is not particularly limited; any binder known to the skilled person may be used. It is, however, preferred that the binder is selected in such a way that it is soluble in the solvent comprised in the formulations according to the present invention. Said binder is preferably selected from the group consisting of polystyrene (PS), polyvinyl alcohol (PVA), polymethylmethacrylate (PMMA) and blends thereof.

The present electron transfer composition or formulation may be processed into an electron transfer layer by a process comprising the steps of (i) depositing the electron transfer composition or formulation on a supporting layer; and (ii) removing the solvent or solvents, for example by evaporation, preferably under at least partially reduced pressure and/or under elevated temperature to obtain an electron transfer layer.

Optionally, above process may comprise the further step of (iii) drying the so-obtained electron transfer layer, preferably under at least partially reduced pressure and/or elevated temperature. Said drying step may for example be performed using an air blade.

The electron transfer compositions and formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

Ink jet printing is particularly preferred when high resolution layers and devices need to be prepared. Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments, Toshiba, TEC or single nozzle microdispensers such as those produced by Microdrop and Microfab may be used.

The type of supporting layer to be used is not particularly limited. Examples of suitable supporting layers onto which the present electron transfer formulation may be deposited are metal oxide substrates and bulk heterojunction layers.

The formulations of the present invention are preferably processed from solution. Preferred examples of such processing techniques are spin-coating and printing techniques. Of these printing techniques are preferred. In order to be applied by ink jet printing or microdispensing, the compounds or polymers should be first dissolved in a suitable solvent. Solvents must fulfill the requirements stated above and must not have any detrimental effect on the chosen print head.

The process of forming the electron transfer layer is preferably carried out at a temperature of the substrate of at least 10° C. and of at most 150° C.

The compositions or formulations of the present invention are useful as electron transfer materials in optical, electrooptical, electronic, electroluminescent or photoluminescent components or devices. Preferably, said devices are selected from the group consisting of photodiodes, organic light emitting diodes, organic photovoltaic devices and photoconductors. Most preferably, said devices are photodiodes. In these devices, the compositions or formulations of the present invention are typically applied as thin layers or films.

Thus, the present invention also provides for the use of the composition or formulations of the present invention in an electronic device or for an electronic device comprising the electron transfer composition or formulation in accordance with the present invention.

The invention additionally provides for an electronic device comprising an electron transfer composition or formulation according to the present invention. Especially preferred devices are OFETs, TFTs, ICs, logic circuits, capacitors, RFID tags, OLEDs, OLETs, OPEDs, OPVs, OPDs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns. More preferably, said devices are selected from the group consisting of photodiodes, organic light emitting diodes, organic photovoltaics and photoconductors. Most preferably, said devices are photodiodes.

A preferred device according to the present invention comprises for example the following layers listed in sequence from bottom to top:
(i) optionally a substrate;
(ii) a high work function electrode, preferably comprising a metal oxide, such as for example indium tin oxide (ITO), serving as anode;
(iii) an electron transfer layer comprising an electron transfer composition in accordance with the present invention;
(iv) an active layer, for example a photoactive layer, which can either be a blend of n- and p-type organic semiconductor or two distinct layers, one of which comprises, preferably consists of, a n-type organic semiconductor and the other comprises, preferably consists of, a p-type organic semiconductor, thus forming a bulk heterojunction (BHJ) layer;
(v) optionally a conducting layer or hole transport layer, preferably comprising an organic polymer or polymer blend, for example a blend of poly(3,4-ethylenedioxythiophene) and poly(styrenesulfonate) (frequently referred to as "PEDOT:PSS"); and
(vi) a cathode, preferably comprising for example silver.

A preferred alternative device according to the present invention comprises for example the following layers listed in sequence from bottom to top:
(i) optionally a substrate;
(ii) a high work function electrode, preferably comprising a metal oxide, such as for example indium tin oxide (ITO), serving as anode;
(iii) optionally a conducting layer or hole transport layer, preferably comprising an organic polymer or polymer blend, for example a blend of poly(3,4-ethylenedioxythiophene) and poly(styrenesulfonate) (frequently referred to as "PEDOT:PSS");
(iv) an active layer, for example a photoactive layer, which can either be a blend of n- and p-type organic semiconductor or two distinct layers, one of which comprises, preferably consists of, a n-type organic semiconductor and the other comprises, preferably consists of, a p-type organic semiconductor, thus forming a bulk heterojunction (BHJ) layer;
(v) an electron transfer layer comprising an electron transfer composition in accordance with the present invention; and
(vi) a cathode, preferably comprising for example silver.

For use in organic photovoltaic or organic photodetector devices an active layer is used that comprises or contains, more preferably consists essentially of, very preferably exclusively of, a p-type (generally but not necessarily an electron donor) semiconductor and a n-type (generally but not necessarily an electron acceptor) semiconductor.

The p-type semiconductor may comprise, or preferably consist of, a polymer and/or a metal oxide. The p-type semiconducting polymer may for example be selected from the group consisting of polythiophenes, polyanilines, polyvinylcarbazoles, polyphenylenes, polyphenylvinylenes, polysilanes, polythienylenevinylenes, polyisothia-naphthanenes, polycyclopentadithiophenes, polysilacyclopentadithiophenes, polycyclopentadithiazoles, polythiazolothiazoles, polythiazoles, polybenzo-thiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, and copolymers thereof. The p-type semiconductor may be a metal oxide that is an intrinsic p-type semiconductor. Examples of such an intrinsic p-type semiconducting metal oxides are copper oxides, strontium copper oxides and strontium titanium oxides. Alternatively the p-type semiconductor may be a metal oxide that forms a p-type semiconductor after doping with a dopant. Examples thereof include p-doped zinc oxides or p-doped titanium oxides. Examples of useful dopants include salts or acids of fluoride, chloride, bromide and iodide.

An example of a particularly suitable polymer is PDPPT-TT, which comprises the following monomeric unit

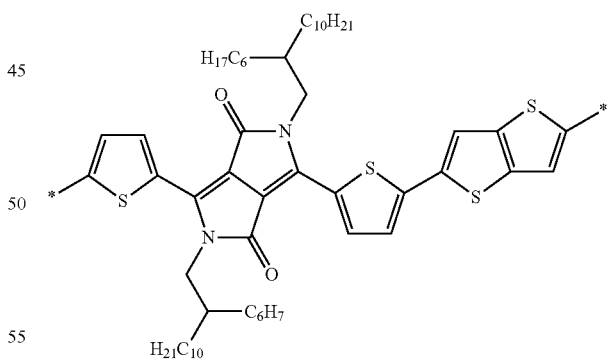

The n-type semiconductor can be an inorganic material such as zinc oxide ($ZnO_x$), zinc tin oxide (ZTO), titan oxide ($TiO_x$), molybdenum oxide ($MoO_x$), nickel oxide ($NiO_x$) or cadmium selenide (CdSe), or an organic material such as graphene or a fullerene or substituted fullerene, for example an indene-$C_{60}$-fullerene bisadduct like ICBA, or a (6,6)-phenyl-butyric acid methyl ester derivatized methano $C_{60}$ fullerene, also known as "PCBM-$C_{60}$" or "$C_{60}$PCBM", as disclosed for example in G. Yu, J. Gao, J. C. Hummelen, F. Wudl, A. J. Heeger, Science 1995, Vol. 270, p. 1789 ff and having the structure shown below, or structural analogous compounds with e.g. a $C_{61}$ fullerene group, a $C_{70}$ fullerene group, or a $C_{71}$ fullerene group, or an organic polymer (see for example Coakley, K. M. and McGehee, M. D. *Chem. Mater.* 2004, 16, 4533).

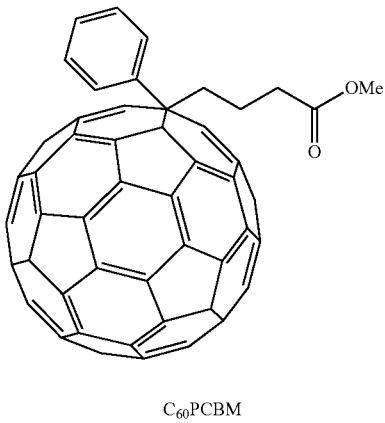

$C_{60}$PCBM

Preferably the active layer comprises an n-type semiconductor such as a fullerene or substituted fullerene, like for example PCBM-$C_{60}$, PCBM-$C_{70}$, PCBM-$C_{61}$, PCBM-$C_{71}$, bis-PCBM-$C_{61}$, bis-PCBM-$C_{71}$, ICMA-$C_{60}$ (1',4'-Dihydro-naphtho[2',3':1,2][5,6]fullerene-$C_{60}$), ICBA-$C_{60}$, oQDM-$C_{60}$ (1',4'-dihydro-naphtho[2',3':1,9][5,6]fullerene-C60-Ih), bis-oQDM-$C_{60}$, graphene, or a metal oxide, like for example, $ZnO_x$, $TiO_x$, ZTO, $MoO_x$, $NiO_x$, or quantum dots like for example CdSe or CdS, to form the active layer in an OPV or OPD device. The device preferably further comprises a first transparent or semi-transparent electrode on a transparent or semi-transparent substrate on one side of the active layer, and a second metallic or semi-transparent electrode on the other side of the active layer.

Further preferably the OPV or OPD device comprises, between the active layer and the first or second electrode, one or more additional buffer layers acting as hole transporting layer and/or electron blocking layer, which comprise a material such as metal oxide, like for example, ZTO, $MoO_x$, $NiO_x$, a conjugated polymer electrolyte, like for example PEDOT:PSS, a conjugated polymer, like for example polytriarylamine (PTAA), an organic compound, like for example N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD), or alternatively as hole blocking layer and/or electron transporting layer, which comprise a material such as metal oxide, like for example, $ZnO_x$, $TiO_x$, a salt, like for example LiF, NaF, CsF, a conjugated polymer electrolyte, like for example poly[3-(6-trimethylammoniumhexyl)thiophene], poly(9,9-bis(2-ethylhexyl)-fluorene]-b-poly[3-(6-trimethylammonium-hexyl)thiophene], or poly [(9,9-bis(3'-(N,N-dimethylamino) propyl)-2,7-fluorene)-alt-2,7-(9,9-dioctylfluorene)] or an organic compound, like for example tris(8-quinolinolato)-aluminium(III) ($Alq_3$), 4,7-diphenyl-1,10-phenanthroline.

To produce thin layers in BHJ OPV or OPD devices the compounds, polymers, polymer blends or formulations of the present invention may be deposited by any suitable method. Liquid (solution) coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing. For the fabrication of OPV devices and modules area printing method compatible with flexible substrates are preferred, for example slot dye coating, spray coating and the like.

The OPV device can for example be of any type known from the literature (see e.g. Waldauf et al., *Appl. Phys. Lett.*, 2006, 89, 233517).

A first preferred OPV device according to the present invention comprises the following layers (in the sequence from bottom to top):
optionally a substrate,
a high work function electrode, preferably comprising a metal oxide, like for example ITO, serving as anode,
an optional conducting polymer layer or hole transport layer, preferably comprising an organic polymer or polymer blend, for example of PEDOT:PSS (poly(3,4-ethylenedioxythiophene): poly(styrene-sulfonate), or TBD (N,N'-dyphenyl-N-N'-bis(3-methylphenyl)-1,1'biphenyl-4,4'-diamine) or NBD (N,N'-dyphenyl-N-N'-bis(1-napthylphenyl)-1,1'biphenyl-4,4'-diamine),
a layer, also referred to as "active layer", comprising a p-type and an n-type organic semiconductor, which can exist for example as a p-type/n-type bilayer or as distinct p-type and n-type layers, or as blend or p-type and n-type semiconductor, forming a BHJ,
optionally a layer having electron transport properties, for example comprising LiF,
a low work function electrode, preferably comprising a metal like for example aluminum, serving as cathode,
wherein at least one of the electrodes, preferably the anode, is transparent to visible light.

A second preferred OPV or OPD device according to the present invention is an inverted OPV device and comprises the following layers (in the sequence from bottom to top):
optionally a substrate,
a high work function metal or metal oxide electrode, comprising for example ITO, serving as cathode,
a layer having hole blocking properties, preferably comprising a metal oxide like $TiO_x$ or $Zn_x$,
an active layer comprising a p-type and an n-type organic semiconductor, situated between the electrodes, which can exist for example as a p-type/n-type bilayer or as distinct p-type and n-type layers, or as blend or p-type and n-type semiconductor, forming a BHJ,
an optional conducting polymer layer or hole transport layer, preferably comprising an organic polymer or polymer blend, for example of PEDOT:PSS or TBD or NBD,
an electrode comprising a high work function metal like for example silver, serving as anode,
wherein at least one of the electrodes, preferably the cathode, is transparent to visible light.

In the OPV or OPD devices of the present invention the p-type and n-type semiconductor materials are preferably selected from the materials, like the polymer/fullerene systems, as described above.

When the active layer is deposited on the substrate, it forms a BHJ that phase separates at nanoscale level. For discussion on nanoscale phase separation see Dennler et al, *Proceedings of the IEEE*, 2005, 93 (8), 1429 or Hoppe et al, Adv. Func. Mater, 2004, 14(10), 1005. An optional annealing step may be then necessary to optimize blend morphology and consequently OPV and OPD device performance.

Another method to optimize device performance is to prepare formulations for the fabrication of OPV(BHJ) devices wherein the formulation may include high boiling point additives to promote phase separation in the right way. 1,8-Octanedithiol, 1,8-diiodooctane, nitrobenzene, chloronaphthalene, and other additives have been used to obtain high-efficiency solar cells. Examples are disclosed in J. Peet, et al, *Nat. Mater.*, 2007, 6, 497 or Fréchet et al. *J. Am. Chem. Soc.*, 2010, 132, 7595-7597.

The compounds, polymers, formulations and layers of the present invention are also suitable for use in an OFET as the semiconducting channel. Accordingly, the invention also provides an OFET comprising a gate electrode, an insulating (or gate insulator) layer, a source electrode, a drain electrode and an organic semiconducting channel connecting the source and drain electrodes, wherein the organic semiconducting channel comprises a compound, polymer, polymer blend, formulation or organic semiconducting layer according to the present invention. Other features of the OFET are well known to those skilled in the art.

For N-type field effect transistors the present electron transfer layer may also be used as a surface treatment material to reduce the work function of source/drain electrodes.

OFETs where an OSC material is arranged as a thin film between a gate dielectric and a drain and a source electrode, are generally known, and are described for example in U.S. Pat. Nos. 5,892,244, 5,998,804, 6,723,394 and in the references cited in the background section. Due to the advantages, like low cost production using the solubility properties of the compounds according to the invention and thus the processibility of large surfaces, preferred applications of these FETs are such as integrated circuitry, TFT displays and security applications.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

An OFET device according to the present invention preferably comprises:
a source electrode,
a drain electrode,
a gate electrode,
an electron transfer layer,
a semiconducting layer,
one or more gate insulator layers, and
optionally a substrate.

The OFET device can be a top gate device or a bottom gate device. Suitable structures and manufacturing methods of an OFET device are known to the skilled in the art and are described in the literature, for example in US 2007/0102696 A1.

The gate insulator layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377). Especially preferred are organic dielectric materials having a low permittivity (or dielectric constant) from 1.0 to 5.0, very preferably from 1.8 to 4.0 ("low k materials"), as disclosed for example in US 2007/0102696 A1 or U.S. Pat. No. 7,095,044.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetry value, like stamps, tickets, shares, cheques etc.

Alternatively, the materials according to the invention can be used in OLEDs, e.g. as the active display material in a flat panel display applications, or as backlight of a flat panel display like e.g. a liquid crystal display. Common OLEDs are realized using multilayer structures. An emission layer is generally sandwiched between one or more electron-transport and/or hole-transport layers. By applying an electric voltage, electrons and holes as charge carriers move towards the emission layer where their recombination leads to the excitation and hence luminescence of the lumophor units contained in the emission layer. The inventive compounds, materials and films may be employed in one or more of the charge transport layers, corresponding to their electrical properties. The selection, characterization as well as the processing of suitable monomeric, oligomeric and polymeric compounds or materials for the use in OLEDs is generally known by a person skilled in the art, see, e.g., Müller et al, *Synth. Metals*, 2000, 111-112, 31-34, Alcala, *J. Appl. Phys.*, 2000, 88, 7124-7128 and the literature cited therein.

A further aspect of the invention relates to both the oxidised and reduced form of the compounds according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, ($NO_2^+$) ($SbF_6^-$), ($NO_2^+$) ($SbCl_6^-$), ($NO_2^+$) ($BF_4^-$), $AgClO_4$, $H_2IrCl_6$, $La(NO_3)_3.6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

The compounds and formulations according to the present invention may also be suitable for use in organic plasmon-emitting diodes (OPEDs), as described for example in Koller et al., *Nat. Photonics*, 2008, 2, 684.

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913 A1.

According to another use the materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, *Proc. Natl. Acad. Sci. U.S.A.*, 1999, 96, 12287; D. Wang, X. Gong, P. S. Heeger, F. Rininsland, G. C. Bazan and A. J. Heeger, *Proc. Natl. Acad. Sci. U.S.A.*, 2002, 99, 49; N. DiCesare, M. R. Pinot, K. S. Schanze and J. R. Lakowicz, *Langmuir*, 2002, 18, 7785; D. T. McQuade, A. E. Pullen, T. M. Swager, *Chem. Rev.*, 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

EXAMPLES

The advantages of the present invention are further illustrated by the following non-limitative examples.

All materials used in the examples were purchased from commercially available sources. Fullerenes such as the ([6,6]-phenyl-$C_{61}$-bytyric acid methyl ester)PCBM were purchased from Nano-C. PDPPT-TT, poly-4-vinylphenol (PVP) and $Cs_2CO_3$ were purchased from Sigma-Aldrich. PEDOT:PSS was purchased as Clevios P VP Al 4083 (ca. 1.5 wt % solution) from Heraeus.

The solution of PEDOT:PSS was diluted 50% with deionized water and with 1% surfactant. PDPPT-TT and PCBM were dissolved in dichlorobenzene in a ratio of 1 to 1.5 so that the total solids concentration was 30 mg of solids per ml. Solutions of 10% $Cs_2CO_3$ and 10% PVP were prepared separately in methanol or in 2-ethoxyethanol. Solutions of 1% poly(styrene-b-acrylic acid) caesium salt and 1% carboxy terminated polystyrene cesium salt were prepared in toluene as solvent.

Device Preparations and Measurements

The ITO glass substrates were cleaned by using the following cleaning procedure: 30 min ultrasonic bath in Dycon 90 solution, followed by washing 3 times with deionized water and another 30 min. ultrasonic bath in deionized water. Then the ITO substrates were patterned by photolithography, forming dots with size of 50 $mm^2$, followed by a cleaning steps.

A first electron transfer layer (ETL) was produced by depositing $Cs_2CO_3$:PVP by spin coating from the solution of $Cs_2CO_3$:PVP (0.5:1 weight ratio), but further diluted 20 times in methanol for reducing the thickness, followed by annealing at 120° C. on a hot plate for 10 min. The thickness of this layer is less than 3 nm. The second type of electron transfer layer (ETL) was poly(styrene-b-acrylic acid) cesium salt deposited from 1% toluene solution by spin coating method. A third electron transfer layer (ETL) was produced by depositing carboxy terminated polystyrene cesium salt from 1% solution in toluene.

On top a layer of PDPPT-TT:PCBM(1:1.5 weight ratio) and a layer of PEDOT-PSS were deposited in sequence by blade coater (K101 Control Coater System) at a temperature of 70° C. The distance between blade and substrate were set to 15-50 m, and the speed was set to 0.2 m/min. The film thickness of PEDOT-PSS and PDPPT-TT:PCBM were 100 nm and 200 nm, respectively. The top Ag metal electrodes were thermally deposited through a shadow mask; the metal dots matched the bottom ITO dots. Top Ag electrodes thickness was 50 nm. The layered structure of three types of photodiodes are listed in Table 1.

TABLE 1

|  | Example 1 | Example 2 | Example 3 |
|---|---|---|---|
| Cathode | Ag | Ag | Ag |
| Conductive layer | PEDOT-PSS | PEDOT-PSS | PEDOT-PSS |
| Active layer | PDPPT-TT:PCBM | PDPPT-TT:PCBM | PDPPT-TT:PCBM |
| ETL | $Cs_2CO_3$: PVP | Carboxy terminated polystyrene cesium salt | Poly(styrene-b-acrylic acid) cesium salt |
| Anode | ITO | ITO | ITO |
| Substrate | Glass | Glass | Glass |

All three devices have a so-called inverted structure with the electron transfer layer (ETL) directly attached to the ITO. Current-voltage (IV) curves were determined on a Keithley 4200 Semiconductor Characterization System. The light source for the photocurrent measurement was a 950 nm light emitting diode with an output power 13 mW. The measurement set up was arranged so that more than 50% of the light reached the surface of photodiode.

The IV curves of the three photodiodes of Examples 1, 2 and 3 showed good performance under dark conditions. The forward current was more than two or three orders of magnitude greater than the reverse current. Of the three tested photodiodes Example 1 showed the best performance in that its forward current was more than one magnitude higher than that of the other two photodiodes, while the reverse currents of Examples 1 to 3 were comparable.

Under 950 nm light condition, all three devices had similar reverse current. The forward current of Example 1 was the same as the dark current, however, the forward currents from Examples 2 and 3 were 5-6 times higher than their dark current. Considering that all three devices had the same functional layers except for the electron transfer layer (ETL), and the workfunction of $Cs_2CO_3$:PVP is 0.1 eV lower than that of the other two, the results may, without wishing to be bound or limited by theory, suggest that the injection charges in Examples 2 and 3 were limited by the energy barrier at ETL/Ag, and the photon induced carriers had a significant contribution to the forward current.

Stability Measurements

Figure 2:
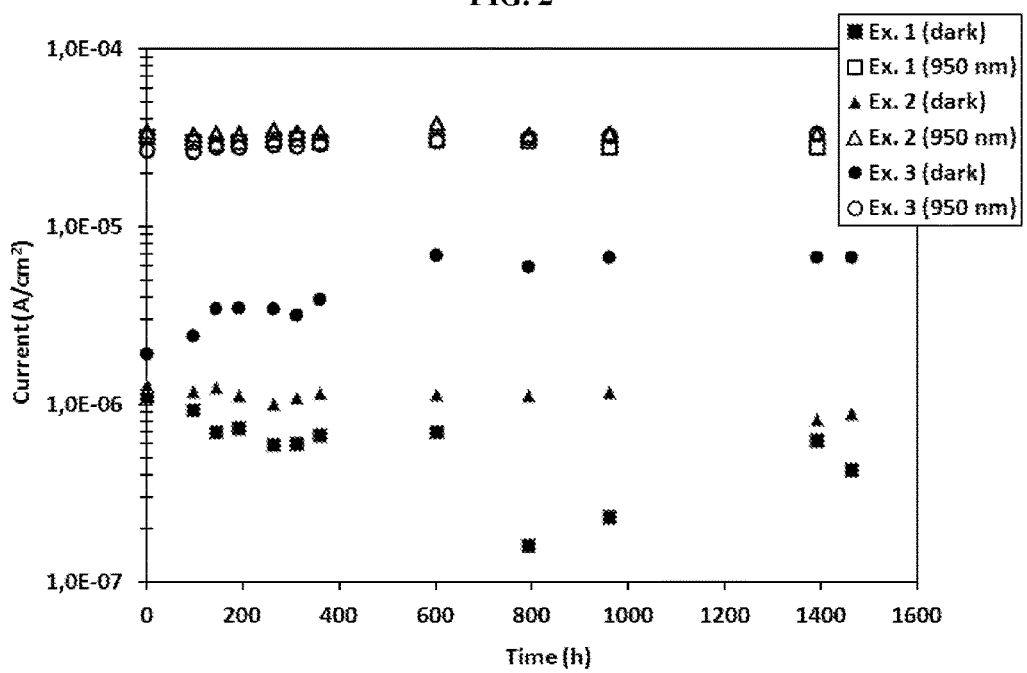
FIG. 2—shows the evolution of current over time for the three photodiodes of Examples 1, 2and 3 in the dark (filled markers) as well as under irradiation with light of 950 nm (unfilled markers).

Device stability was tested on the non-encapsulated devices, which in between measurements were stored under nitrogen in a glove box. For the measurements the devices were transferred out of the glove box and exposed to ambient conditions for ca. one hour, which was roughly the time required for a single measurement. After completing the measurement the devices were re-introduced into the glove box. FIG. 2 shows the dark and photocurrent vs. storage time in the glove box. The current was measured at −4 V in the dark as well as under 950 nm irradiation (13 mW).

As indicated in FIG. 2, all three photodiodes showed very good to excellent long term stability over the measurement period. The dark current of Example 2 even started to increase after 90 hrs storage time, though at present the reasons for this behavior are unclear.

The invention claimed is:

1. An electron transfer composition comprising a metal carboxylate selected from the group consisting of

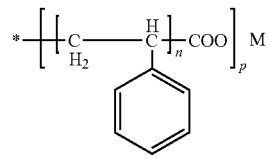
(I)

wherein
("*") denotes a linkage to an adjacent unit or group, or where the metal carboxylate of formula I is a polymer, ("*") denotes a link to an adjacent repeating unit or to a terminal group of the polymer chain,
n is at least 1,
p=1 and M=$Cs^+$, or
p=2 and M=$Ba^{2+}$,

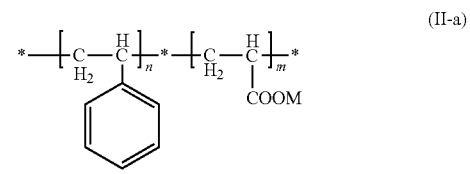
(II-a)

(II-b)

wherein
("*") denotes a linkage to an adjacent unit or group, or where the metal carboxylate of formula II-a or II-b is a polymer, ("*") denotes a link to an adjacent repeating unit or to a terminal group of the polymer chain,
n is 0-10,000,
m is at least 1 and
M=$Cs^+$ or 0.5 $Ba^{2+}$,
and

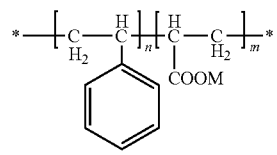
(III)

Wherein
("*") denotes a linkage to an adjacent unit or group, or where the metal carboxylate of formula III is a polymer, ("*") denotes a link to an adjacent repeating unit or to a terminal group of the polymer chain,
n is at least 1,
m is 0 to 10,000,
R is a phenyl group substituted with at least group COOM or an alkyl group substituted with at least one group COOM and
M=$Cs^+$ or M=0.5 $Ba^{2+}$.

2. An electron transfer composition according to claim 1, wherein the metal carboxylate is selected from the group consisting of

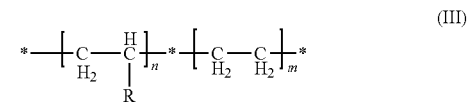

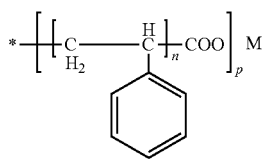

wherein n is at least 1, p=1 and M=Cs, and

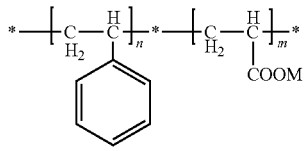

wherein n is 0 to 10,000, m is at least 1 and M=Cs.

3. An electron transfer composition according to claim 1, wherein the electron transfer composition additionally comprises $Cs_2CO_3$.

4. An electron transfer composition according to claim 1 further comprising one or more compounds or polymers having properties selected from the group consisting of semiconducting, charge transport, hole/electron transport, hole/electron blocking and electrically conducting, properties.

5. An electron transfer composition according to claim 1, wherein the polymer comprises one or more monomers selected from the following group consisting of olefins and fluorinated olefins, acrylic acid, vinyl, dienes styrene, methacrylic acid and derivatives of these.

6. A formulation comprising the electron transfer composition of claim 1, and one or more solvents.

7. A formulation according to claim 6, wherein the one or more solvents is selected from the group consisting of water, alcohols and blends of these.

8. A method for making a component or device which comprises incorporating the electron transfer composition of claim 1 as a charge transport, semiconducting, electrically conducting, photoconducting or light emitting material in an optical, electrooptical, electronic, electroluminescent or photoluminescent component or device.

9. An organic electronic component or device comprising an electron transfer layer, said electron transfer layer consisting of the electron transfer composition of claim 1.

10. An organic electronic component or device which includes an electron transfer composition according to claim 1, wherein the electronic component or device is selected from the group consisting of organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), organic solar cells (O-SC), photodiodes, laser diodes, photoconductors, organic photodetectors (OPD), electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

11. An organic electronic component or device according to claim 10, wherein the organic electronic component or device is selected from the group consisting of photodiode, organic light emitting diode (OLED), photoconductor and organic photovoltaic device.

12. An organic electronic component or device according to claim 10, wherein the organic electronic component or device is a photodiode.

* * * * *